(12) United States Patent
Kim et al.

(10) Patent No.: US 8,456,889 B2
(45) Date of Patent: Jun. 4, 2013

(54) SEMICONDUCTOR DEVICES INCLUDING VARIABLE RESISTANCE MATERIALS AND METHODS OF OPERATING THE SAME

(75) Inventors: Young-bae Kim, Seoul (KR); In-kyeong Yoo, Yongin-si (KR); Chang-jung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 105 days.

(21) Appl. No.: 12/929,519

(22) Filed: Jan. 31, 2011

(65) Prior Publication Data

US 2011/0188290 A1 Aug. 4, 2011

(30) Foreign Application Priority Data

Feb. 3, 2010 (KR) .................. 10-2010-0010132

(51) Int. Cl.
*G11C 11/00* (2006.01)
(52) U.S. Cl.
USPC .................................. 365/148; 365/157
(58) Field of Classification Search
USPC ........... 365/148, 157, 158; 257/324, E29.309
See application file for complete search history.

(56) References Cited

U.S. PATENT DOCUMENTS

| | | | |
|---|---|---|---|
| 5,401,714 A | 3/1995 | Chaudhari et al. | |
| 7,602,012 B2* | 10/2009 | Hashimoto | 257/324 |
| 7,636,251 B2* | 12/2009 | Park et al. | 365/148 |
| 2005/0111252 A1 | 5/2005 | Bednorz et al. | |
| 2005/0247969 A1* | 11/2005 | Ono et al. | 257/314 |
| 2007/0007579 A1 | 1/2007 | Scheuerlein et al. | |

FOREIGN PATENT DOCUMENTS

| | | |
|---|---|---|
| JP | 2006-303293 A | 11/2006 |
| JP | 2009-129916 A | 6/2009 |
| KR | 10-0849755 A | 6/2007 |
| KR | 10-074456 B1 | 7/2007 |
| KR | 10-0862216 B1 | 10/2008 |
| KR | 2009-0091765 A | 8/2009 |
| WO | WO 2009/099732 | 8/2009 |
| WO | WO 2010/001108 | 1/2010 |

OTHER PUBLICATIONS

Office Action issued May 20, 2011, in corresponding European Patent Application No. 11152964.0-2203.

* cited by examiner

*Primary Examiner* — Vu Le
(74) *Attorney, Agent, or Firm* — Harness, Dickey & Pierce, P.L.C.

(57) ABSTRACT

Semiconductor devices including variable resistance materials and methods of operating the semiconductor devices. The semiconductor devices use variable resistance materials with resistances that vary according to applied voltages as channel layers.

34 Claims, 9 Drawing Sheets $V_{w1} > V_2 > V_{w2} > V_1 > V_{r1} = V_{r2}$

SEMICONDUCTOR DEVICES INCLUDING VARIABLE RESISTANCE MATERIALS AND METHODS OF OPERATING THE SAME

CROSS-REFERENCE TO RELATED APPLICATION

This application claims priority under 35 U.S.C. §119 to Korean Patent Application No. 10-2010-0010132, filed on Feb. 3, 2010, in the Korean Intellectual Property Office (KIPO), the entire contents of which is incorporated herein in by reference.

BACKGROUND

1. Field

Example embodiments relate to semiconductor devices including variable resistance materials and methods of operating the same, and more particularly, to semiconductor devices using variable resistance materials as a channel layer, the resistance of the variable resistance materials varying according to an applied voltage, and methods of operating the semiconductor devices.

2. Description of the Related Art

Materials with resistances that vary in an electric and/or magnetic field, or according to application of an electric current and/or voltage, are used in memories and/or logic circuits. For example, in a magnetic tunnel junction (MTJ) device, a variable resistance material that changes between a high-resistance state and a low-resistance state according to a magnetization direction is used. As another example, in resistance random access memories (RRAM), which generally use a transition metal oxide as a variable resistance material, resistance is changed according to an applied voltage.

A memory and/or a device such as a logic circuit may require a switching device for applying various voltages to the memory and/or device. For example, a switching device may be required to apply a set voltage, a reset voltage, and/or a read voltage to a variable resistance material. The switching device and the variable resistance material are connected in series with each other. A transistor is generally used as the switching device. However, a diode may also be used as the switching device. For example, a structure, in which one transistor and one variable resistance material are connected to each other, may be referred to as 1T-1R structure.

SUMMARY

Example embodiments include semiconductor devices using variable resistance materials that vary according to applied voltages and methods of operating the semiconductor devices.

According to example embodiments, a semiconductor device includes a gate, and a source and a drain facing each other, a variable resistance layer, a resistance of which varies depending on an applied voltage and a gate insulating layer disposed between the gate and the variable resistance layer.

The variable resistance layer may perform as a channel region between the source and the drain. The gate insulating layer may cover at least partially the source and the drain facing each other. P-type semiconductor layers may be further disposed between the variable resistance layer and the source and the variable resistance layer and the drain, and the source and the drain may be $n^+$ doped. Conductive thin film layers may be further disposed between the p-type semiconductor layers and the variable resistance layer. The conductive thin film layer may be formed of metal, a conductive metal oxide, or a conductive metal nitride.

The conductive thin film layers may be further disposed between the variable resistance layer and the source and between the variable resistance layer and the drain. The source and the drain may be formed of an oxide semiconductor. The oxide semiconductor may be a zinc oxide (ZnO) based metal oxide semiconductor or a tin oxide (SnO2)-based metal oxide semiconductor. A conductive layer may be further disposed on an opposite side to the gate insulating layer. At least a center portion of the variable resistance layer may protrude to contact side surfaces of the source and the drain, which face each other. Upper surfaces of the source and the drain and an upper surface of the protruding portion of the variable resistance layer may be located at the same height. The gate insulating layer may cover the upper surface of the protruding portion in the variable resistance layer and at least partially cover the upper surfaces of the source and the drain.

According to other example embodiments, methods of driving semiconductor devices include providing a semiconductor device which includes a gate, and a source and a drain facing each other, a variable resistance layer, a resistance of which varies depending on an applied voltage, and a gate insulating layer disposed between the gate and the variable resistance layer, applying a voltage that is equal to or greater than a threshold voltage to the gate and changing a resistance of the variable resistance layer or reading a resistance value of the variable resistance layer by connecting one of the source and the drain to ground and applying a set voltage, a reset voltage, or a read voltage to the other one of the source and the drain.

When the variable resistance layer may be formed of a unipolar material, the reset voltage may be included in a section between a first voltage and a second voltage, which increases the resistance value of the variable resistance layer, the set voltage may be included in a section greater than the second voltage, which reduces the resistance value of the variable resistance layer, and the read voltage may be included in a section smaller than the first voltage, which does not change the resistance value of the variable resistance layer.

When the variable resistance layer is formed of a bipolar material, the reset voltage may be included in a voltage section that is equal to or smaller than a negative third voltage, which reduces the resistance value of the variable resistance layer, the set voltage may be included in a voltage section that is greater than a positive fourth voltage, which increases the resistance value of the variable resistance layer, and the read voltage may be included in a voltage section that is smaller than the fourth voltage, which does not change the resistance value of the variable resistance layer.

According to still other example embodiments, methods of driving semiconductor devices include providing a semiconductor device which includes a gate, and a source and a drain facing each other, a variable resistance layer, a resistance of which varies depending on an applied voltage, a gate insulating layer disposed between the gate and the variable resistance layer and a conductive layer disposed on an opposite side to the gate insulating layer, applying a voltage that is equal to or greater than a threshold voltage to the gate, changing a resistance of a first region in the variable resistance layer or reading a resistance value of the first region in the variable resistance layer by connecting the conductive layer to ground and applying a set voltage, a reset voltage, or a read voltage to the source and changing a resistance of a second region in the variable resistance layer or reading a resistance value of the second region in the variable resistance layer by connecting the conductive layer to ground and applying a set voltage, a reset voltage, or a read voltage to the drain.

According to yet other example embodiments, a semiconductor device includes a variable resistance layer, a gate insulating layer on the variable resistance layer and a gate on the gate insulating layer.

According to further example embodiments, a method of operating a semiconductor device including a gate, a source, a drain, a variable resistance layer and a gate insulating layer between the gate and the variable resistance layer includes applying a voltage that is equal to or greater than a threshold voltage to the gate and performing one of changing a resistance of the variable resistance layer and reading a resistance value of the variable resistance layer by connecting one of the source and the drain to ground and applying one of a set voltage, a reset voltage, and a read voltage to the other one of the source and the drain.

According to still further example embodiments, a method of operating a semiconductor device including a gate, a source, a drain, a variable resistance layer, a gate insulating layer between the gate and the variable resistance layer, and a conductive layer on a side of the variable resistance layer opposite the gate insulating layer includes applying a voltage that is one of equal to and greater than a threshold voltage to the gate, performing one of changing a resistance of a first region in the variable resistance layer and reading a resistance value of the first region in the variable resistance layer by connecting the conductive layer to ground and applying one of a set voltage, a reset voltage, and a read voltage to the source and performing one of changing a resistance of a second region in the variable resistance layer and reading a resistance value of the second region in the variable resistance layer by connecting the conductive layer to ground and applying one of a set voltage, a reset voltage, and a read voltage to the drain.

According to yet further example embodiments, a switchable memory device includes a channel layer including a variably resistive material, a gate insulating layer on the channel layer, and a gate on the gate insulating layer, the gate configured to induce a channel region in the channel layer.

BRIEF DESCRIPTION OF THE DRAWINGS

Example embodiments will be more clearly understood from the following brief description taken in conjunction with the accompanying drawings. FIGS. 1A-15 represent non-limiting, example embodiments as described herein.

FIG. 1A is a cross-sectional diagram of a semiconductor device including a variable resistance material according to example embodiments;

FIG. 2 is a graph of a voltage-current characteristic for a variable resistance layer of FIG. 1A including a unipolar material;

FIG. 3 is a diagram illustrating example voltage pulses applied to the variable resistance layer for recording, reading, and erasing data of a variable resistance layer of FIG. 1A including a unipolar material;

FIG. 4 is a graph of a voltage-current characteristic for a variable resistance layer of FIG. 1A including a bipolar material;

FIG. 5 is a diagram illustrating example voltage pulses applied to the variable resistance layer for recording, reading, and erasing data of a variable resistance layer of FIG. 1A including a bipolar material;

FIGS. 8-13 are cross-sectional diagrams of semiconductor devices including variable resistance materials according to example embodiments;

FIG. 14 is a schematic diagram illustrating memory cards according to example embodiments; and FIG. 15 is a block diagram illustrating electronic systems according to example embodiments.

Figure 1A:
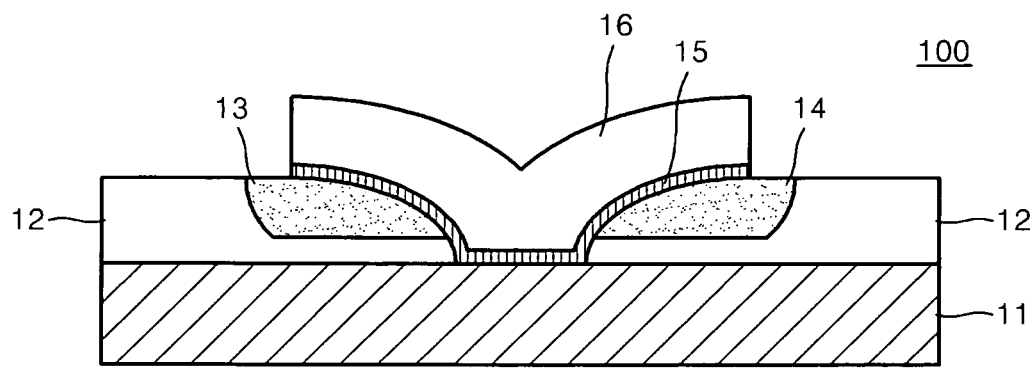

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a cross-sectional diagram of a semiconductor device 100 including a variable resistance material according to example embodiments. Referring to FIG. 1A, the semiconductor device 100 may include a variable resistance layer 11, a source 13, a drain 14, a gate insulating layer 15 and a gate 16. A resistance of the variable resistance layer 11 may, for example, vary according to an applied voltage and/or current. The source 13 and the drain 14 may be on sides of an upper surface of the variable resistance layer 11. The gate insulating layer 15 may be partially on the upper surface of the variable resistance layer 11 between the source 13 and the drain 14. The gate 16 may be on the gate insulating layer 15. The variable resistance layer 11 may include a channel region between the source 13 and the drain 14.

The variable resistance layer 11 may be a variable resistance material, the resistance of which varies depending on an applied voltage. For example, when a voltage that is equal to or greater than a set voltage is applied to the variable resistance layer, the resistance may be reduced (e.g., a turned-on (ON) status). When a voltage that is equal to or greater than a reset voltage is applied to the variable resistance layer, the resistance may increase (e.g., a turned-off (OFF) status). The variable resistance material may be a transition metal oxide (TMO). For example, the variable resistance layer 11 may be one of Ni oxide, Cu oxide, Ti oxide, Co oxide, Hf oxide, Zr oxide, Zn oxide, W oxide, Nb oxide, TiNi oxide, LiNi oxide, Al oxide, InZn oxide, V oxide, SrZr oxide, SrTi oxide, Cr oxide, Fe oxide, Ta oxide, and compounds thereof. A variable resistance material with a variable resistance according to a voltage/current application may be a multi-component metal oxide (e.g., $Pr_{1-x}Ca_xMnO_3$ (PCMO) and/or $SrTiO_3$ (STO)) and/or a solid electrolyte material, and may be the variable resistance layer 11.

Referring to FIG. 1A, the gate insulating layer 15 may be partially on the upper surface of the variable resistance layer 11 between the source 13 and the drain 14 so that the variable resistance layer 11 is not directly between the source and the drain 14. The gate insulating layer 15 may partially cover side surfaces of the source 13 and the drain 14. As illustrated in FIG. 1A, side surfaces of the source 13 and the drain 14 closest to each other may be lowered gradually (e.g., curved and/or sloped).

Although example embodiments are described with respect to a source 13 and the drain 14 with side surfaces that may be lowered gradually, other configurations are possible. The gate 16 may, for example, vertically overlap the source 13 and the drain 14 without any horizontal overlap (not shown). The gate 16 may be, for example, a recessed gate that does not overlap the source 13 or the drain 14 (not shown). The source 13 and the drain 14 may be self-aligned to the gate 16 (not shown). Further, example embodiments may include a gate insulating layer 15 that is configured to store data. For example, the gate insulating layer 15 may include a gate insulating layer, a charge storage layer and a blocking layer. The semiconductor device 100 may be configured to store multi-bit data (e.g., stored charge may, as one example, modulate a resistance of the variable resistance layer 11).

In the semiconductor device 100 of FIG. 1A, only the gate insulating layer 15 and the gate 16 may be between the source 13 and the drain 14. Electrical connection between the source 13 and the drain 14 may be dependent on a voltage applied to the gate 16. The gate insulating layer 15 may be, for example, a silicon oxide layer ($SiO_2$) and/or a silicon nitride layer (SiN). The gate 16 may be, for example, a polycrystalline silicon (poly-Si) and/or indium tin oxide (ITO).

The source 13 and the drain 14 may include a semiconductor material (e.g., silicon). As illustrated in FIG. 1A, a p-type semiconductor layer 12 (that is, a p-type silicon layer) may be between the variable resistance layer 11 and the source 13, and between the variable resistance layer 11 and the drain 14. The source 13 and the drain 14 may be two $n^+$ doping regions of the p-type semiconductor layer 12. The semiconductor device 100 according to example embodiments is not limited to the above structure. For example, an n-type semiconductor layer may be used instead of the p-type semiconductor layer 12, and the source 13 and the drain 14 may be p$^+$ doped. The p-type semiconductor layer 12, the source 13, and the drain 14 may be a nitride-based semiconductor material. The source 13 and the drain 14, which may be n+ doped, may be on the variable resistance layer 11 without a p-type semiconductor layer 12.

Figure 1B:
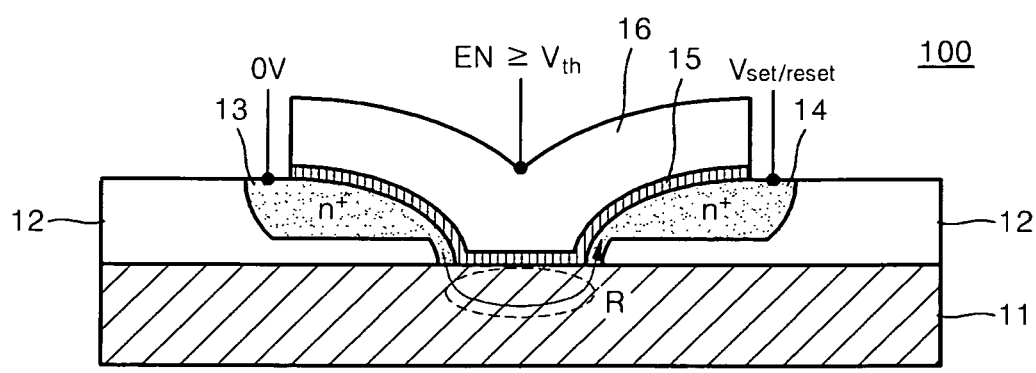
FIG. 1B is a cross-sectional schematic diagram illustrating methods of operating the semiconductor device of FIG. 1A.

FIG. 1B is a cross-sectional schematic diagram illustrating methods of operating the semiconductor device of FIG. 1A. Referring to FIG. 1B, a voltage EN that is equal to or greater than a threshold voltage $V_{th}$ may be applied to the gate 16. An electric channel between the source 13 and the drain 14 may be induced in a region R in the variable resistance layer 11 under the gate insulating layer 15. An electric current may flow from the source 13, through the region R in the variable resistance layer 11 and to the drain 14.

Upon application of voltage between the source 13 and the drain 14, the resistance state of the variable resistance layer 11 may be adjusted or the resistance value of the variable resistance layer 11 may be read. For example, upon connection of the source 13 to ground (0V) and application of a set voltage $V_{set}$ to the drain 14, the resistance of the variable resistance layer 11 may be reduced. Upon connection of the source 13 to ground (0V) and application of a reset voltage $V_{reset}$ to the drain 14, the resistance of the variable resistance layer 11 may be increased. Upon application of a read voltage $V_{read}$ that does not generate variation in the variable resistance layer 11 to the drain 14, the resistance value of the variable resistance layer 11 may be read.

A larger variety of resistance states may be obtained according to the applied voltage in some variable resistance materials that constitute a variable resistance layer 11. The semiconductor device 100 of FIG. 1A may produce the same operational effect as that of the 1T-1R structure. In methods of operating a semiconductor device 100 according to example embodiments, the drain 14 may be connected to ground, and the set voltage $V_{set}$, the reset voltage $F_{reset}$, or the read voltage $V_{read}$ may be applied to the source 13. Although example embodiments are described with respect to a source 13 and a drain 14, the semiconductor device 100 may be bi-directional.

Setting, resetting, and reading operations may be dependent upon whether the variable resistance material of the variable resistance layer 11 is unipolar or bipolar.

Figure 2:
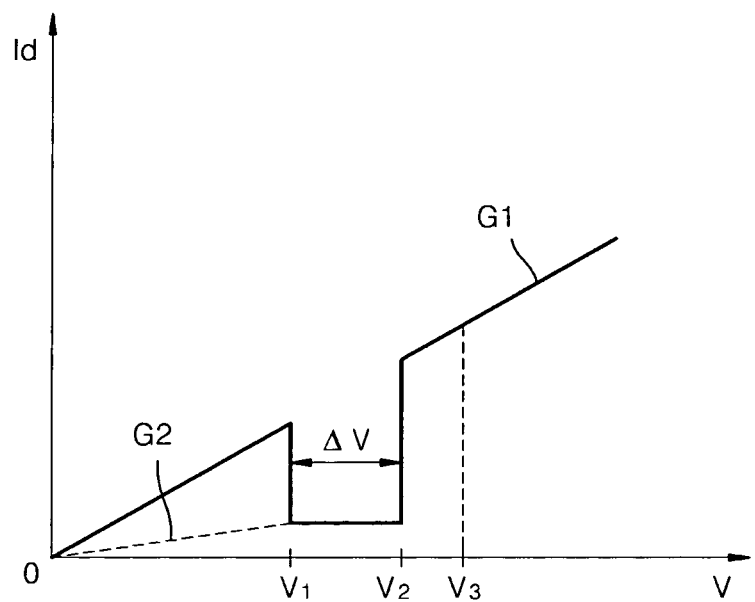

FIG. 2 is a graph of a voltage-current characteristic for a variable resistance layer 11 including a unipolar material. In the graph of FIG. 2, a horizontal axis may denote a voltage V that is applied to the variable resistance layer 11 due to a voltage applied between the source 13 and the drain 14, and a voltage EN applied to the gate 16 that is about equal to or greater than the threshold voltage $V_{th}$. A vertical axis may denote an electric current Id flowing between the source 13 and the drain 14 as a function of the voltage V. A first graph G1 denoted by a solid line may represent a current-voltage curve of the variable resistance layer 11 in a low resistance state. A second graph G2 denoted by a dotted line may represent a current-voltage curve of the variable resistance layer 11 in a high resistance state.

Referring to the first graph G1, the current Id may change in proportion to the voltage V applied to the variable resistance layer 11 from 0V to V1. Upon application of a first voltage V1 to the variable resistance layer 11 (V1>0), the resistance of the variable resistance layer 11 may increase and the current Id of the variable resistance layer 11 may be reduced. The variable resistance layer may be switched to the high resistance state. The high resistance state of the variable resistance layer 11 may be maintained until a second voltage of V2(V2>V1) is applied to the variable resistance layer 11. A high resistance state of the variable resistance layer 11 may be maintained in a section ΔV(V1~V2). Upon application of the second voltage V2 to the variable resistance layer 11, the resistance of the variable resistance layer 11 may decrease and the current Id may increase. The variable resistance layer 11 may be switched to the low resistance state. At voltages greater than the second voltage V2 the current Id of the variable resistance layer 11 may change in proportion to the applied voltage.

A voltage applied to the variable resistance layer 11 that is greater than the first voltage V1 may determine a resistance state of the variable resistance layer for voltages less than the first voltage V1. For example, a third voltage V3 (V3>V2) may be applied to switch the variable resistance layer 11 to the low resistance state (a first status). Upon subsequent application of a voltage smaller than the first voltage V1 to the variable resistance layer 11, a current value according to the first graph G1 may be measured. A voltage that is equal to or greater than the first voltage V1 and equal to or smaller than the second voltage V2 (V1≦V≦V2) may be applied to the variable resistance layer 11 to switch the variable resistance layer 11 to the high resistance state (a second status). Upon subsequent application of a voltage that is less than the first voltage V1 to the variable resistance layer 11, the current value according to the second graph G2 may be measured from the variable resistance layer 11.

As illustrated in the graph of FIG. 2, at a voltage that is less than the first voltage V1, the current value measured according to the second graph G2 may be smaller than the current value measured according to the first graph G1. Two different current values may be measured from the variable resistance layer 11 at a voltage that is less than the first voltage V1. The two measured current values may be data "0" and "1" recorded in the variable resistance layer 11. The first status may be a case where the data "1" is recorded in the variable resistance layer 11, and the second status may be a case where the data "0" is recorded in the variable resistance layer 11. Example embodiments are not so limited and the first status may be the case where the data "0" is recorded in the variable resistance layer and the second status may be the case where the data "1" is recorded in the variable resistance layer 11. The data may be recorded in the variable resistance layer 11 by applying voltages according to the voltage-current characteristic of the variable resistance layer 11 and the recorded data may be read and/or erased.

Figure 3:
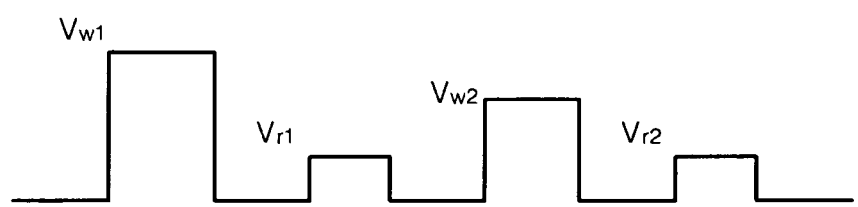

FIG. 3 is a diagram illustrating example voltage pulses applied to a variable resistance layer 11 for recording, reading, and erasing data for a variable resistance layer 11 including a unipolar material. In FIG. 3, $V_{w1}$ may denote a first write voltage pulse that may be applied to the variable resistance layer 11 for recording data "1". The first write voltage pulse $V_{w1}$ may correspond to the third voltage V3 of FIG. 2 and may be a set voltage. $V_{r1}$ may denote a first read voltage pulse that may be applied to the variable resistance layer 11 for reading the data "1" recorded in the variable resistance layer 11. The first read voltage pulse $V_{r1}$ may be a voltage that is less than the first voltage V1 of FIG. 2.

As represented in the first graph G1 of FIG. 2, when the third voltage V3 is applied to the variable resistance layer 11, the resistance of the variable resistance layer 11 is reduced. The low resistance of the variable resistance layer 11 is maintained when the voltage $V_{r1}$ is applied to the variable resistance layer 11. When the first read voltage pulse $V_{r1}$ is applied to the variable resistance layer 11 as shown in FIG. 3, the current value measured in the variable resistance layer 11 may be greater than the current value that is measured after a voltage between the first voltage V1 and the second voltage V2 is applied to the variable resistance layer 11. The data "1" may be recorded in the variable resistance layer 11.

The voltage $V_{w2}$ of FIG. 3 is a second write voltage pulse that may be applied to the variable resistance layer 11 in order to record the data "0" in the variable resistance layer 11. The second write voltage pulse $V_{w2}$ may be a reset voltage. The second write voltage pulse $V_{w2}$ may be a voltage between the first and second voltages V1 and V2. The second write voltage pulse $V_{w2}$ may be smaller than the first write voltage pulse $V_{w1}$. Upon application of the second write voltage pulse $V_{w2}$ to the variable resistance layer 11, the resistance of the variable resistance layer 11 may be increased and the variable resistance layer 11 may be switched to the high resistance state (refer to FIG. 2).

The high resistance state of the variable resistance layer 11 may be maintained upon application of a voltage pulse to the variable resistance layer 11 that is less than the first voltage V1 (refer to the second graph G2 of FIG. 2). The voltage $V_{r2}$ may denote a second read voltage pulse that is applied to the variable resistance layer 11 in order to read the data "0" from the variable resistance layer 11. The second read voltage pulse $V_{r2}$ may be smaller than the first voltage V1 (e.g., equal to the first read voltage pulse $V_{r1}$). Upon application of the second read voltage pulse $V_{r2}$ to the variable resistance layer 11 after applying the second write voltage pulse $V_{w2}$ to the variable resistance layer 11, a current value measured in the variable resistance layer 11 may be smaller than a current value measured when the data "1" is read from the variable resistance layer 11.

Figure 4:
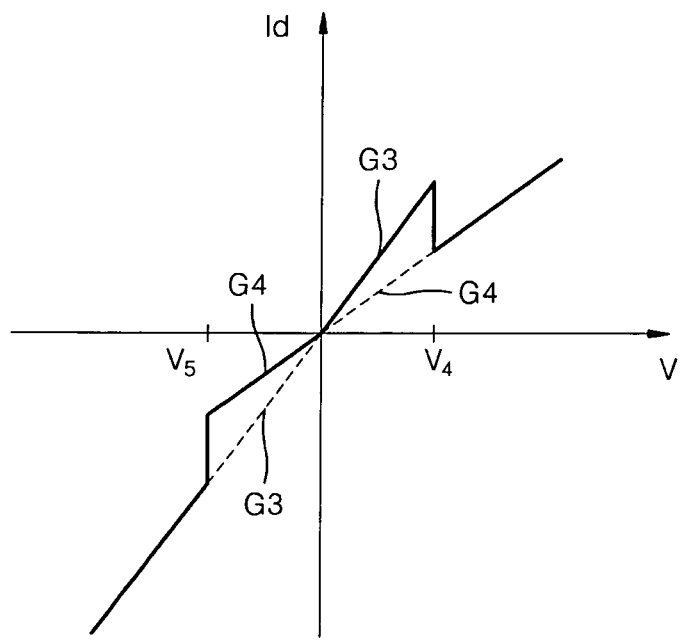

FIG. 4 is a graph of a current-voltage characteristic for a variable resistance layer 11 including a bipolar material. In the graph of FIG. 4, a horizontal axis may denote a voltage V that is applied to the variable resistance layer 11 due to a voltage applied between the source 13 and the drain 14, and a voltage EN applied to the gate 16 that is about equal to or greater than the threshold voltage $V_{th}$. In the graph of FIG. 4, the vertical axis may denote the current Id flowing between the source 13 and the drain 14 as a function of the voltage V.

When comparing the graph of FIG. 4 with the graph of FIG. 2, the voltage-current characteristic of the bipolar material shown in FIG. 4 may be different from that of the unipolar material. In FIG. 4, a third graph G3 may illustrate a voltage-current characteristic of the bipolar variable resistance layer 11 in a voltage range V5<V<V4 after a negative voltage V that is less than or equal to a fifth voltage V5 (V≦V5<0) is applied to the variable resistance layer 11. A fourth graph G4 may illustrate a voltage-current characteristic of the variable resistance layer 11 in a voltage range V5<V<V4 after a positive voltage V that is greater than or equal to a fourth voltage V4 (V≧V4>0) is applied to the variable resistance layer 11.

Referring to the third and fourth graphs G3 and G4, upon application of a voltage that is greater than or equal to the fourth voltage V4 to the variable resistance layer 11, the variable resistance layer 11 may be in a high resistance state. The voltage-current characteristic of the variable resistance layer 11 may be illustrated by the fourth graph G4. After applying a voltage that is greater than or equal to the fourth voltage V4 to the variable resistance layer 11, the high resistance of the variable resistance layer 11 (a third status) may be maintained until the negative fifth voltage V5 is applied to the variable resistance layer 11.

Referring to the third and fourth graphs G3 and G4, upon application of a negative voltage that is less than or equal to the fifth voltage V5 to the variable resistance layer 11, the variable resistance layer 11 may be in a low resistance state. The voltage-current characteristic of the variable resistance layer 11 is illustrated by the third graph G3. After a negative voltage that is less than or equal to the fifth voltage V5 is applied to the variable resistance layer 11, the low resistance of the variable resistance layer 11 (a fourth status) may be maintained until the positive fourth voltage V4 is applied to the variable resistance layer 11.

As represented by the third and fourth statuses, two current values (and/or two resistance values) of the variable resistance layer 11 may exist in a voltage range between the negative fifth voltage V5 and the positive fourth voltage V4. One of the third status and the fourth statuses may correspond to the data "1", and the other may correspond to the data "0". The status of the variable resistance layer 11 may be determined by applying a voltage that is equal to or greater than the fourth voltage V4 or equal to or smaller than the fifth voltage V5 to the variable resistance layer 11.

A voltage for recognizing the status of the variable resistance layer 11 may be smaller than the fourth voltage V4 or greater than the fifth voltage V5. The status of the variable resistance layer 11 may be maintained after recognizing (e.g., reading) the status of the variable resistance layer 11. A reading operation according to example embodiments may not be destructive and data recorded in the variable resistance layer 11 may not be changed as a result of the reading operation. Hereinafter, it will be described that the data "1" is recorded in the third status and the data "0" is recorded in the fourth status for convenience of description.

Figure 5:
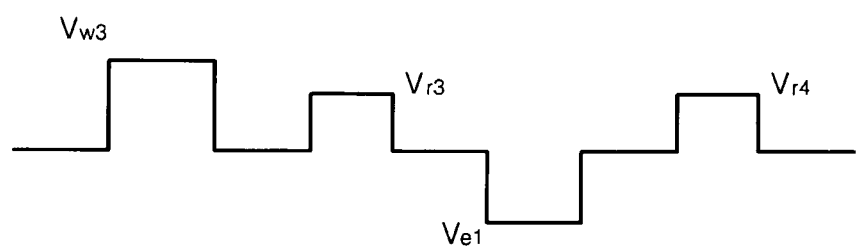

FIG. 5 is a diagram illustrating example voltage pulses applied to the variable resistance layer 11 for recording, reading, and erasing data of a variable resistance layer 11 including a bipolar material. Referring to FIG. 5, $V_{w3}$ may denote a third write voltage pulse that may be applied to the variable resistance layer 11 in order to record the data "1" in the variable resistance layer 11. The third write voltage pulse $V_{w3}$ may be equal to or greater than the fourth voltage V4 and may be a set voltage.

A voltage $V_{r3}$ may denote a third read voltage pulse applied to the variable resistance layer 11 in order to read the data "1" recorded in the variable resistance layer 11 by the application of the third write voltage pulse $V_{w3}$. The third read voltage pulse $V_{r3}$ may be less than the third write voltage $V_{w3}$ ($V_{r3}<V_{w3}$). The third read voltage pulse $V_{r3}$ may be greater than 0 and less than the fourth voltage V4 ($0<V_{r3}<V4$). Because the third read voltage pulse $V_{r3}$ may be the same polarity as the third write voltage pulse $V_{w3}$, and may be less than the third write voltage $V_{w3}$, a resistance value of the variable resistance layer 11 may not be changed upon application of the third read voltage pulse $V_{r3}$ to the variable resistance layer 11.

According to a variable resistance layer 11 including a bipolar material, the resistance of the variable resistance layer 11 may be reduced by a voltage that is equal to or less than the negative fifth voltage V5. The fifth voltage V5 may be a voltage for erasing the data recorded in the variable resistance layer 11 by the application of the third write voltage pulse $V_{w3}$ applied to the variable resistance layer 11.

In FIG. 5, $V_{e1}$ may denote a first erasing voltage pulse corresponding to the fifth voltage V5. Upon application of the first erasing voltage pulse $V_{e1}$ to the variable resistance layer 11, the resistance of the variable resistance layer 11 may be reduced and data recorded in the variable resistance layer may be erased. The first erasing voltage pulse $V_{e1}$ may be a reset voltage. The low resistance state of the variable resistance layer 11 may be considered as data recorded in the variable resistance layer 11. The first erasing voltage pulse $V_{e1}$ may be a write voltage for recording data (e.g., data "0") in the variable resistance layer 11.

In FIG. 5, $V_{r4}$ may be a fourth read voltage pulse applied to read the data "0" from the variable resistance layer 11 recorded by the first erasing voltage pulse $V_{e1}$. The fourth read voltage pulse $V_{r4}$ may be less than an absolute value of the first erasing voltage pulse $V_{e1}$ ($V_{r2}<|V_{e1}|$). For example, the fourth read voltage pulse $V_{r4}$ may be equal to the third read voltage pulse $V_{r3}$. After applying the first erasing voltage pulse $V_{e1}$ to the variable resistance layer 11, the variable resistance layer 11 may maintain the low resistance state despite application of the fourth read voltage pulse $V_{r4}$ to the variable resistance layer 11. The variable resistance layer 11 may not require a re-storage process that is generally performed after reading data.

Figure 6A:
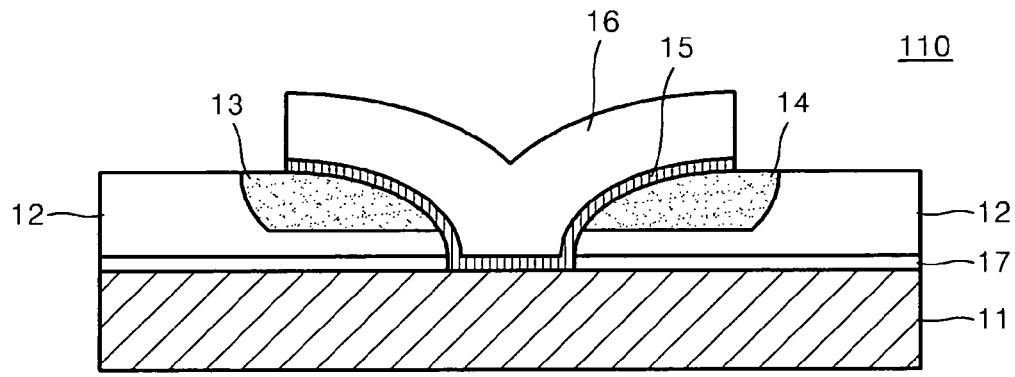
FIG. 6A is a cross-sectional diagram of a semiconductor device including a variable resistance layer according to example embodiments.

FIG. 6A is a cross-sectional diagram of a semiconductor device 110 including a variable resistance layer according to example embodiments. Referring to FIG. 6A, a conductive thin film layer 17 may be between the p-type semiconductor layer 12 and the variable resistance layer 11. The structure of the semiconductor device 110 may otherwise be the same or similar to that of the semiconductor device 100 shown in FIG. 1A. In FIG. 6A, the conductive thin film layer 17 may be between the p-type semiconductor layer 12 and the variable resistance layer 11 (e.g., may separate the p-type semiconductor layer 12 from the variable resistance layer 11). The conductive thin film layer 17 may be between part of the p-type semiconductor layer 12 and the variable resistance layer 11 (e.g., partially separate the p-type semiconductor layer 12 from the variable resistance layer 11).

The conductive thin film layer 17 may be a metal or a conductive metal oxide. For example, the conductive thin film layer 17 may be Pt, Ru, Ir, W, and/or Ti, a conductive metal oxide (e.g., ITO and/or indium zinc oxide (IZO)), a conductive metal nitride (e.g., TiN), or a compound thereof. The conductive thin film layer 17 may prevent or reduce characteristic degradation caused due to an inadequate interface between the variable resistance layer 11 and the p-type semiconductor layer 12.

Figure 6B:
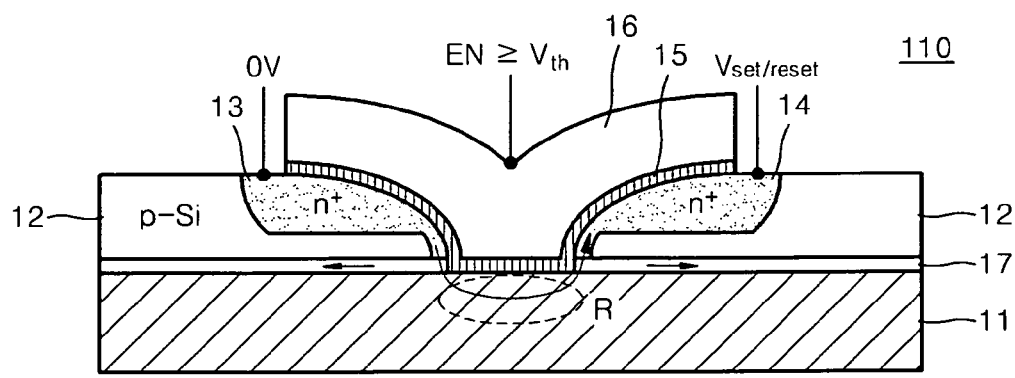
FIG. 6B is a cross-sectional schematic diagram illustrating methods of operating the semiconductor device of FIG. 6A.

FIG. 6B is cross-sectional schematic diagram illustrating methods of operating the semiconductor device 110 of FIG. 6A. Referring to FIG. 6B, a voltage EN that is about equal to or greater than the threshold voltage $V_{th}$ may be applied to the gate 16. An electric channel between the source 13 and the drain 14 may be induced in a region R of the variable resistance layer 11 that is adjacent to the gate insulating layer 15. Current may flow from the source 13, through the region R in the variable resistance layer 11, and to the drain 14 in the semiconductor device 110. The resistance state of the variable resistance layer 11 may be adjusted or the resistance value of the variable resistance layer 11 may be read by applying a voltage between the source 13 and the drain 14. As illustrated in FIG. 6B, the current may be transferred to the entire region of the variable resistance layer 11 through the conductive thin film layer 17, expanding the region through which current is transferred. The resistance variance in the variable resistance layer 11 may be generated easily by using the conductive thin film layer 17.

Figure 7A:
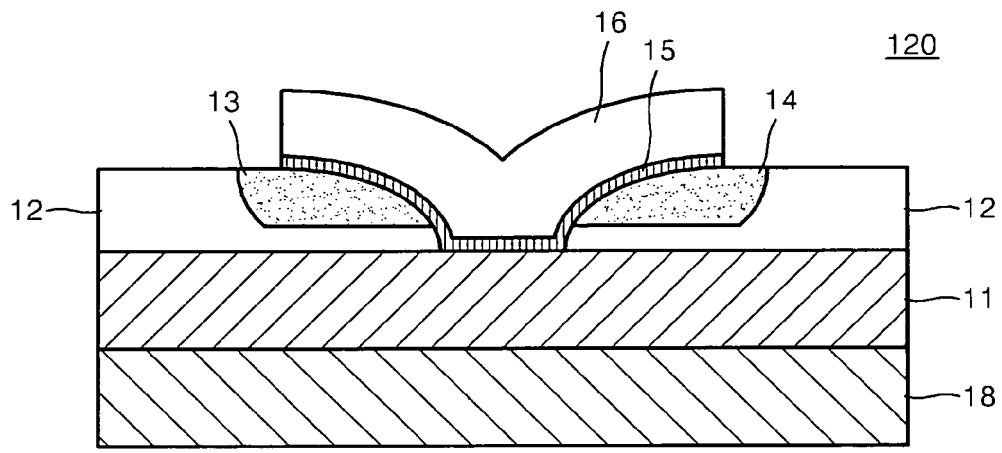
FIG. 7A is a cross-sectional diagram of a semiconductor device including a variable resistance layer according to example embodiments.

FIG. 7A is a cross-sectional diagram of a semiconductor device 120 including a variable resistance layer according to example embodiments. Referring to FIG. 7A, a conductive layer 18 may be on a bottom surface of the variable resistance layer 11. The conductive layer 18 may be a metal of high conductivity (e.g., Pt), a conductive oxide and/or a conductive nitride. Other elements in the semiconductor device 120 except for the conductive layer 18 may be the same or similar to those of the semiconductor device 110 shown in FIG. 1A and a description thereof may be omitted.

Figure 7B:
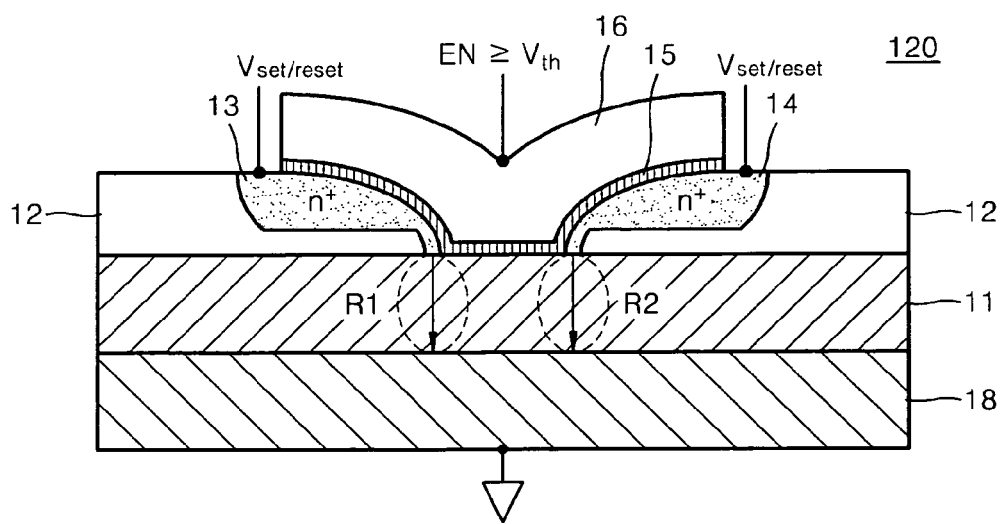
FIG. 7B is a cross-sectional schematic diagram illustrating methods of operating the semiconductor device of FIG. 7A.

FIG. 7B is a cross-sectional schematic diagram illustrating methods of operating the semiconductor device 120 of FIG. 7A. Referring to FIG. 7B, upon application of a voltage that is equal to or greater than the threshold voltage $V_{th}$ to the gate 16, an electric channel connected to the source 13 may be induced in a first region R1 of the variable resistance layer 11 under the gate insulating layer 15 and an electric channel connected to the drain 14 may be induced in a second region R2 in the variable resistance layer 11 under the gate insulating layer 15. Current may flow from the source 13 to the conductive layer 18 mainly through the first region R1. The current may flow from the drain 14 to the conductive layer 18 mainly through the second region R2.

In the semiconductor device 120 of FIG. 7A, two regions R1 and R2, the resistance states of which may vary independently according to voltages applied to the source and drain, may be in one variable resistance layer 11. For example, upon application of a voltage that is equal to or greater than the threshold voltage $V_{th}$ to the gate 16, connection of the conductive layer 18 to ground, and application of a set voltage $V_{set}$ to the source 13, a resistance of the first region R1 in the variable resistance layer 11 may be reduced. Upon application of a reset voltage $V_{reset}$ to the source 13, the resistance of the first region R1 in the variable resistance layer 11 may be increased. Upon application of a read voltage $V_{read}$ to the source 13, a resistance value of the first region R1 in the variable resistance layer 11 may be read.

Upon application of a voltage that is equal to or greater than the threshold voltage $V_{th}$ to the gate 16, connection of the conductive layer 18 to ground, and application of a set voltage $V_{set}$ to the drain 14, the resistance of the second region R2 in the variable resistance layer 11 may be reduced. Upon application of a reset voltage $V_{reset}$ to the drain 14, a resistance of the second region R2 in the variable resistance layer 11 may be increased. Upon application of a read voltage $V_{read}$ to the drain 14, a resistance value of the second region R2 in the variable resistance layer 11 may be read.

In order to avoid or reduce interference between the two regions R1 and R2, a voltage of 0V may be applied to the drain 14 while a voltage is applied to the source 13 to change or read the resistance of the first region R1. While the voltage is applied to the drain 14 in order to change or read the resistance of the second region R2, a voltage of 0V may be applied to the source 13. The semiconductor device 120 of FIG. 7A may include two 1T-1R structures. Single or multi-bit data may be stored.

Figure 8:
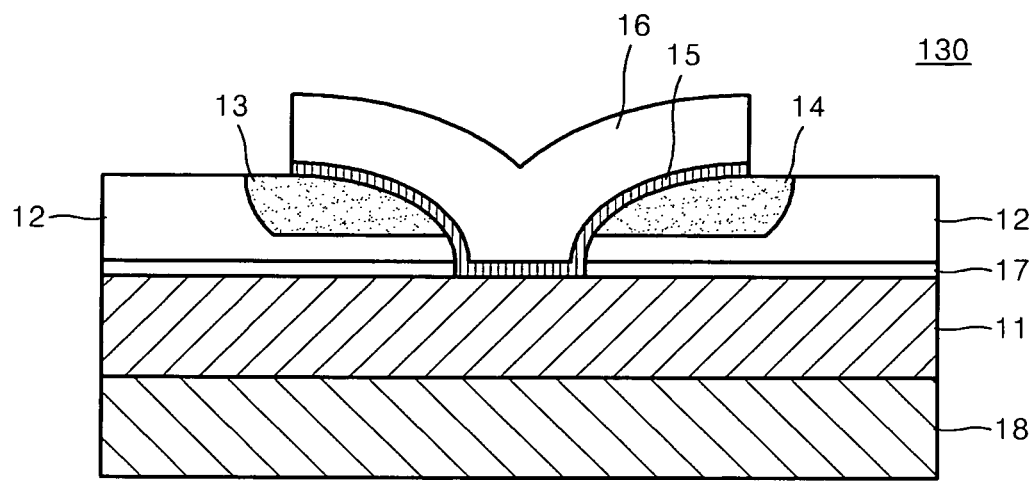

FIG. 8 is a cross-sectional diagram of a semiconductor device 130 including a variable resistance material according to example embodiments. In the semiconductor device 130 of FIG. 8, a conductive thin film layer 17 may be between the p-type semiconductor layer 12 and the variable resistance layer 11. Except for the conductive thin film layer 17, the structure of the semiconductor device 130 of FIG. 8 may be the same or similar to the structure of the semiconductor device 120 of FIG. 7A. Because of the conductive thin film layer 17, resistance changes in the two regions R1 and R2 of the variable resistance layer 11 may be generated easily. The methods of operating the semiconductor device 130 may be the same or similar to methods of operating the semiconductor 120 described with reference to FIG. 7B and a description thereof may be omitted.

Figure 9:
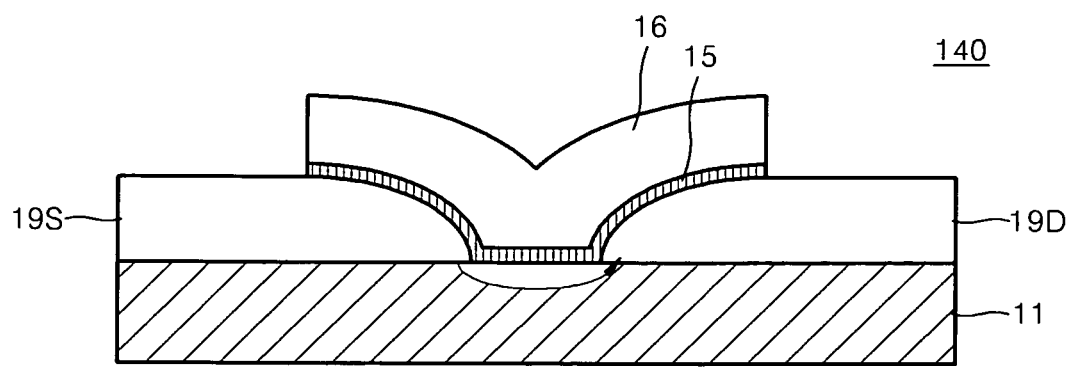

FIG. 9 is a cross-sectional diagram of a semiconductor device 140 including a variable resistance material according to example embodiments. The structure of the semiconductor device 140 of FIG. 9 is similar to that of the semiconductor device 100 shown in FIG. 1A, except that the p-type semiconductor layer 12 may not exist on the variable resistance layer 11. A source 19S and a drain 19D may be on the upper surface of the variable resistance layer 11 (e.g., directly on). Referring to FIG. 9, the source 19S and the drain 19D are on sides of the upper surface of the variable resistance layer 11. The source 19S and the drain 19D may be, for example, an oxide-based semiconductor material. For example, a zinc-oxide (ZnO) based and/or a tin-oxide ($SnO_2$) based metal oxide semiconductor may be used for the source 19S and the drain 19D. The source 19S and the drain 19D may be, for example, an oxide-based semiconductor material doped with an impurity. Methods of operating the semiconductor device 140 of FIG. 9 may be the same or similar to methods of operating the semiconductor 100 described with reference to FIG. 1B and a description thereof may be omitted.

Figure 10:
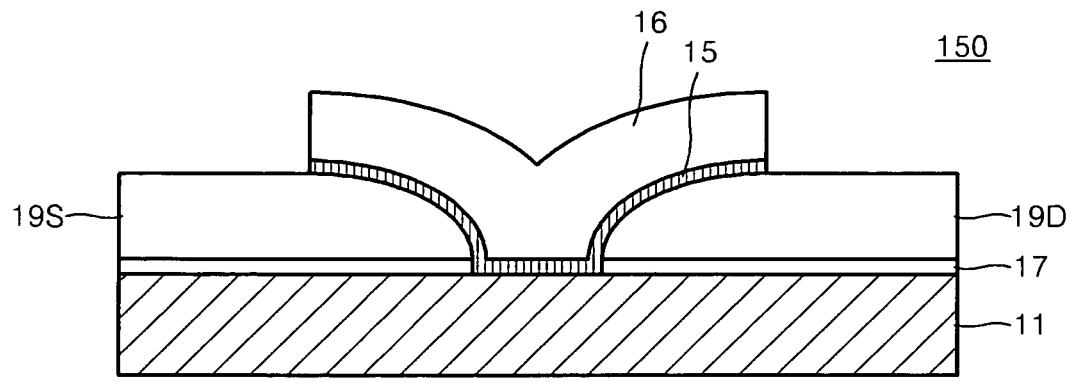

FIG. 10 is a cross-sectional diagram of a semiconductor device 150 including a variable resistance layer according to example embodiments. Referring to FIG. 10, conductive thin film layers 17 may be between the source 19S and the variable resistance layer 11, and the drain 19D and the variable resistance layer 11. Other components of the semiconductor device 150 of FIG. 10 may be the same or similar to those of the semiconductor device 140 of FIG. 9 and a description thereof may be omitted. In FIG. 10, the conductive thin film layer 17 may be entirely between the source 19S and the variable resistance layer 11, and the drain 19D and the variable resistance layer 11. The conductive thin film layer 17 may be partially between the source 19S and the variable resistance layer 11, and the drain 19D and the variable resistance layer 11. Methods of operating the semiconductor device 150 of FIG. 10 may be the same or similar to methods of operating the semiconductor 110 described with reference to FIG. 6B and a description thereof may be omitted.

Figure 11:
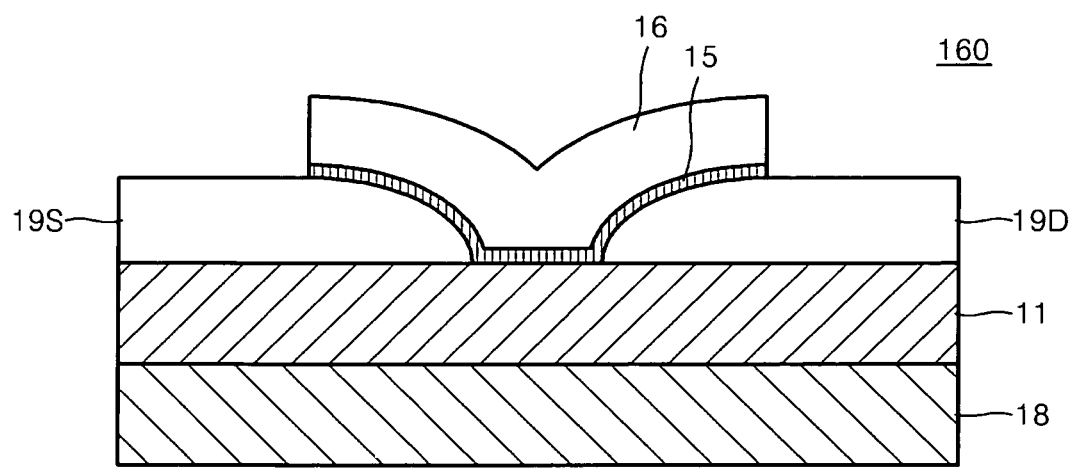

FIG. 11 is a cross-sectional diagram of a semiconductor device 160 including a variable resistance material according to example embodiments. Referring to FIG. 11, a conductive layer 18 may be on a bottom surface of the variable resistance layer 11. Other elements of the semiconductor device 160 except for the conductive layer 18 may be the same or similar to those of the semiconductor device 140 shown in FIG. 9 and a description thereof may be omitted. Because the conductive layer 18 is on the bottom surface of the variable resistance layer 11, the semiconductor device 160 of FIG. 11 may include two 1T-1R structures. Methods of operating the semiconductor device 160 of FIG. 11 may be the same or similar to methods of operating the semiconductor 120 described with reference to FIG. 7B and a description thereof may be omitted.

Figure 12:
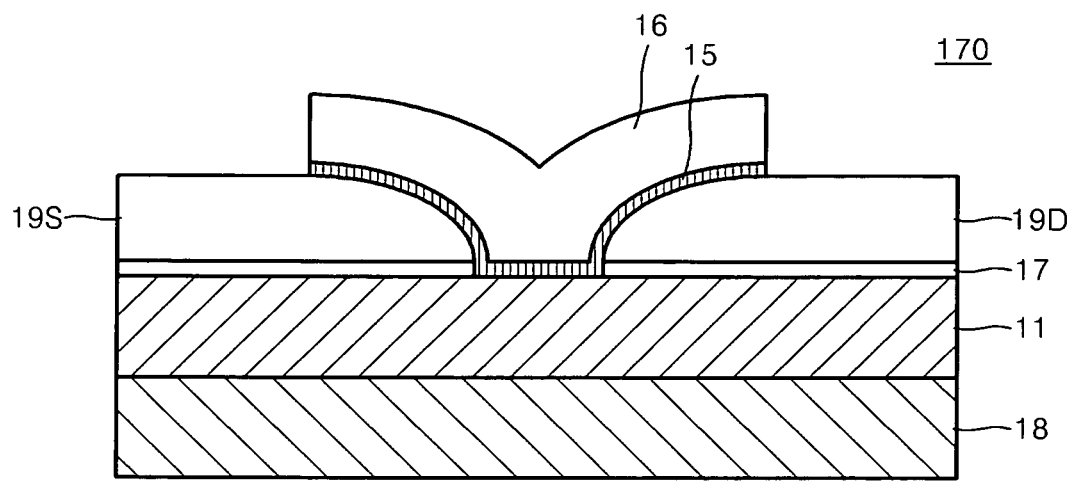

FIG. 12 is a cross-sectional diagram of a semiconductor device 170 including a variable resistance material according to example embodiments. Referring to FIG. 12, a conductive thin film layer may be between the source 19S and the variable resistance layer 11, and the drain 19D and the variable resistance layer 11. The conductive layer 18 may be on a bottom surface of the variable resistance layer 11. The structure of the semiconductor device 170 of FIG. 12 may be the same or similar to that of the semiconductor device 160 of FIG. 11, except that the conductive thin film layer 17 may be included. Methods of operating the semiconductor device 170 of FIG. 12 may be the same or similar to methods of operating the semiconductor device 120 described with reference to FIG. 7B and a description thereof may be omitted.

Figure 13:
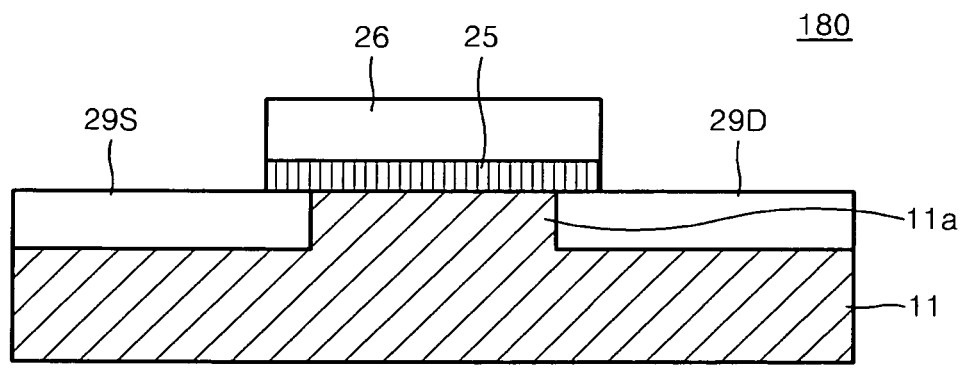

FIG. 13 is a cross-sectional diagram of a semiconductor device 180 including a variable resistance layer according to example embodiments. Referring to FIG. 13, at least a center portion 11a of the variable resistance layer 11 may protrude and may contact side surfaces of a source 29S and a drain 29D. The semiconductor device 180 of FIG. 13 may include the variable resistance layer 11, at least the center portion 11a of which protrudes, the source 29S and the drain 29D on two sides of the upper surface of the variable resistance layer 11 to contact both side surfaces of the center portion 11a of the variable resistance layer 11, a gate insulating layer 25 on the center portion 11a of the variable resistance layer 11, a source 29S, a drain 29D, and a gate 26 on the gate insulating layer 25. As illustrated in FIG. 13, upper surfaces of the source 29S and the drain 29D, and the upper surface of the protruding center portion 11a of the variable resistance layer 11 may be located at a same height. A flat gate insulating layer 25 may cover the entire surface of the protruding center portion 11a of the variable resistance layer 11. The gate insulating layer 25 may, at least partially, cover the upper surfaces of the source 29S and the drain 29D.

The semiconductor device 180 of FIG. 13 may be fabricated in a simpler manner than the other semiconductor devices of the previous embodiments. In the semiconductor device 180 of FIG. 13, a part (that is, the center portion 11a) of the variable resistance layer 11 may be directly between the source 29S and the drain 29D, and the gate insulating layer 25 and the gate 26 may be on the center portion 11a. A threshold voltage of the gate 26 may be reduced. Turning on and turning off of the channel region through which current flows between the source 29S and the drain 29D may not be absolutely dependent on the gate voltage, and the channel region may be partially turned on or off by a voltage applied between the source 29S and the drain 29D. A variation ratio of the resistance in the variable resistance layer 11 may be increased.

The semiconductor device 180 may include the conductive thin film layer 17 (not shown) between the source 29S and the variable resistance layer 11, and the drain 29D and the variable resistance layer 11. The semiconductor device 180 may include the conductive layer 18 (not shown) on a bottom surface of the variable resistance layer 11. According to example embodiments, the variable resistance layer 11 may not be present. For example, a material of the source 29S and the drain 29D may be etched to form a space between the source 29S and the drain 29D that is filled with a variable resistance material.

Figure 14:
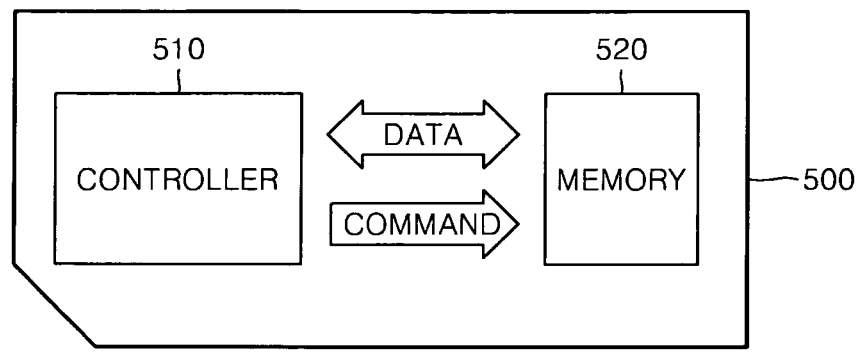

FIG. 14 is a schematic diagram illustrating a memory card 500 according to example embodiments. Referring to FIG. 14, a controller 510 and a memory 520 may exchange electric signals. For example, according to commands of the controller 510, the memory 520 and the controller 510 may exchange data. The memory card 500 may either store data in the memory 520 and/or output data from the memory 520. The memory 520 may include one of the semiconductor devices described above in reference to FIGS. 1-13.

Such a memory card 500 may be used as a storage medium for various portable electronic devices. For example, the memory card 500 may be a multimedia card (MMC) and/or a secure digital (SD) card.

Figure 15:
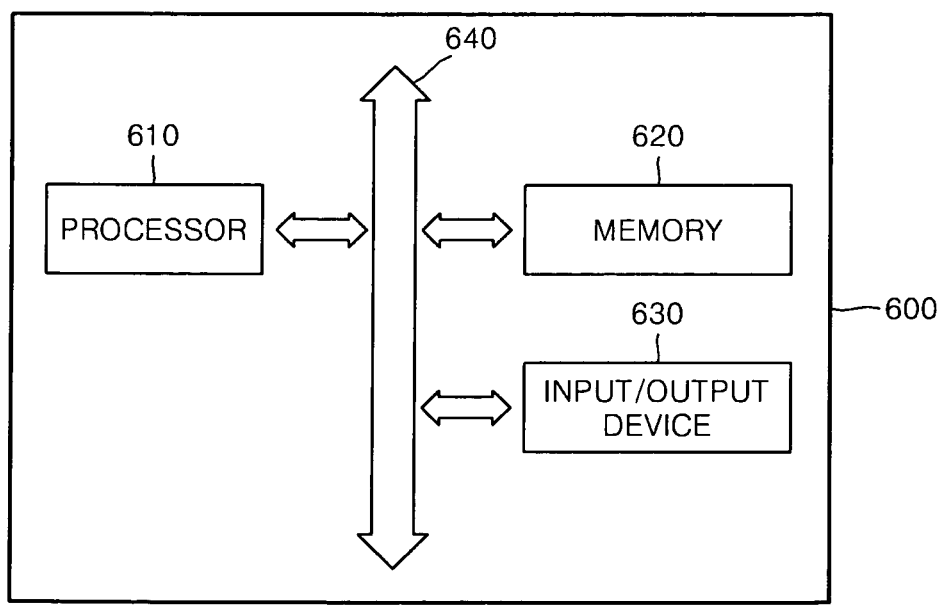

FIG. 15 is a block diagram roughly illustrating an electronic system 600 according to example embodiments. Referring to FIG. 15, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device (e.g. a personal computer or a network) by using the input/output device 630 and may exchange data with the external device.

The memory 620 may store codes or programs for operations of the processor 610. For example, the memory 620 may include one of the semiconductor devices described above in reference to FIGS. 1-13. For example, such an electronic system 600 may embody various electronic control systems requiring the memory 620, and, for example, may be used in mobile phones, MP3 players, navigation devices, solid state disks (SSD), or household appliances.

While example embodiments have been particularly shown and described, it will be understood by one of ordinary skill in the art that variations in form and detail may be made therein without departing from the spirit and scope of the claims. For example, although example embodiments are describes with respect to top gate structures, one having ordinary skill in the art will understand that bottom gate structures are within the scope of example embodiments.

What is claimed is:

1. A semiconductor device, comprising:
a variable resistance layer;
a gate insulating layer on the variable resistance layer; and
a gate on the gate insulating layer, the gate being configured to induce a channel region, the channel region including the variable resistance layer.

2. The semiconductor device of claim 1, wherein at least a part of the variable resistance layer adjacent to the gate is the channel region connecting a source and drain.

3. The semiconductor device of claim 1, further comprising:
a source and drain on the variable resistance layer,
wherein the source and drain each include at least one sloped sidewall, and
the gate insulating layer is on the sloped sidewalls of the source and drain.

4. The semiconductor device of claim 1, further comprising:
at least one semiconductor layer; and
a source and drain on the at least one semiconductor layer,
wherein the gate is between the source and drain, and
the at least one semiconductor layer is between the variable resistance layer and the source, and between the variable resistance layer and the drain.

5. The semiconductor device of claim 4, wherein the at least one semiconductor layer is p-type, and
the source and drain are n-type.

6. The semiconductor device of claim 4, further comprising:
a conductive layer,
wherein the variable resistance layer is between the conductive layer and the gate insulating layer.

7. The semiconductor device of claim 4, further comprising:
at least one conductive thin film layer between the at least one semiconductor layer and the variable resistance layer.

8. The semiconductor device of claim 7, further comprising:
a conductive layer,
wherein the variable resistance layer is between the conductive layer and the gate insulating layer.

9. The semiconductor device of claim 7, wherein the at least one conductive thin film layer is at least one of a metal, a conductive metal oxide and a conductive metal nitride.

10. The semiconductor device of claim 1, further comprising:
a source and drain on the variably resistance layer; and
at least one conductive thin film layer between the variable resistance layer and the source, and between the variable resistance layer and the drain.

11. The semiconductor device of claim 1, further comprising: a
source and drain on the variable resistance layer, the source and drain including an oxide semiconductor.

12. The semiconductor device of claim 11, further comprising:
at least one conductive thin film layer between the variable resistance layer and the source, and between the variable resistance layer and the drain.

13. The semiconductor device of claim 11, further comprising:
a conductive layer,
wherein the variable resistance layer is between the conductive layer and the gate insulating layer.

14. The semiconductor device of claim 12, further comprising:
a conductive layer,
wherein the variable resistance layer is between the conductive layer and the gate insulating layer.

15. The semiconductor device of claim 11, wherein the oxide semiconductor is at least one of a zinc oxide (ZnO) based metal oxide semiconductor and a tin oxide (SnO$_2$)-based metal oxide semiconductor.

16. The semiconductor device of claim 1, further comprising:
a conductive layer,
wherein the variable resistance layer is between the conductive layer and the gate insulating layer.

17. The semiconductor device of claim 16, further comprising:
a source and drain on the variable resistance layer, the channel region including a first channel region and a second channel region,
wherein at least a part of the variable resistance layer is the first channel region connecting the source and the conductive layer, and
at least a part of the variable resistance layer is the second channel region connecting the drain and the conductive layer.

18. The semiconductor device-of claim 1, further-comprising:
a source and drain on the variable resistance layer,
wherein a protruding portion of the variable resistance layer separates the source and drain.

19. The semiconductor device of claim 18, wherein upper surfaces of the source and the drain and an upper surface of the protruding portion of the variable resistance layer are at a same level.

20. The semiconductor device of claim 19, wherein the gate insulating layer covers the upper surface of the protruding portion of the variable resistance layer and at least partially covers the upper surfaces of the source and the drain.

21. The semiconductor device of claim 18, further comprising:
at least one conductive thin film layer between the variable resistance layer and the source, and between the variable resistance layer and the drain.

22. The semiconductor device of claim 18, further comprising:
a conductive layer,
wherein the variable resistance layer is between the conductive layer and the gate insulating layer.

23. A method of operating a semiconductor device including a gate, a source, a drain, a variable resistance layer and a gate insulating layer between the gate and the variable resistance layer, the method comprising:

applying a voltage that is equal to or greater than a threshold voltage to the gate; and performing one of changing a resistance of the variable resistance layer and reading a resistance value of the variable resistance layer by connecting one of the source and the drain to ground and applying one of a set voltage, a reset voltage, and a read voltage to the other one of the source and the drain.

24. The method of claim 23, wherein the variable resistance layer is a unipolar material, the reset voltage is between a first voltage and a second voltage, and increases the resistance value of the variable resistance layer, the set voltage is of a greater magnitude than either of the first and second voltages, and reduces the resistance value of the variable resistance layer, the read voltage is of a lesser magnitude than either of the first and second voltages, and does not change the resistance value of the variable resistance layer, and the reset, set and read voltages are a same polarity.

25. The method of claim 23, wherein the variable resistance layer is a bipolar material, the reset voltage is equal to or less than a negative first voltage, and reduces the resistance value of the variable resistance layer, the set voltage is greater than a positive second voltage, and increases the resistance value of the variable resistance layer, and the read voltage is less than the second voltage, and does not change the resistance value of the variable resistance layer.

26. A method of operating a semiconductor device including a gate, a source, a drain, a variable resistance layer, a gate insulating layer between the gate and the variable resistance layer, and a conductive layer on a side of the variable resistance layer opposite the gate insulating layer, the method comprising:

applying a voltage that is one of equal to and greater than a threshold voltage to the gate;

performing one of changing a resistance of a first region in the variable resistance layer and reading a resistance value of the first region in the variable resistance layer by connecting the conductive layer to ground and applying one of a set voltage, a reset voltage, and a read voltage to the source; and performing one of changing a resistance of a second region in the variable resistance layer and reading a resistance value of the second region in the variable resistance layer by connecting the conductive layer to ground and applying one of a set voltage, a reset voltage, and a read voltage to the drain.

27. The method of claim 26, wherein the variable resistance layer is a unipolar material, the reset voltage is between a first voltage and a second voltage, and increases a resistance value of the variable resistance layer, the set voltage is of a greater magnitude than either of the first and second voltages, and reduces the resistance value of the variable resistance layer, the read voltage is of a lesser magnitude than either of the first and second voltages, and does not change the resistance value of the variable resistance layer, and the reset, set and read voltages are a same polarity.

28. The method of claim 26, wherein the variable resistance layer is a bipolar material, the reset voltage is equal to or less than a negative first voltage, and reduces a resistance value of the variable resistance layer, the set voltage is greater than a positive second voltage, and increases the resistance value of the variable resistance layer, and the read voltage is less than the second voltage, and does not change the resistance value of the variable resistance layer.

29. A switchable memory device, comprising:

a channel layer including a variably resistive material;

a gate insulating layer on the channel layer; and a gate on the gate insulating layer, the gate configured to induce a channel region in the channel layer, the channel region including the variably resistive material.

30. The switching memory device of claim 29, further comprising:

a semiconductor layer on the channel layer, the semiconductor layer including a source and drain, wherein the gate is configured to induce the channel region in the channel layer and the semiconductor layer to connect the source and drain.

31. The switching memory device of claim 29, further comprising:

an oxide semiconductor layer including a source and a drain, wherein the gate is configured to induce the channel region to connect the source and drain.

32. The switching memory device of claim 31, wherein the gate is further configured to induce the channel region in the oxide semiconductor layer.

33. A memory card, comprising:

a controller; and a memory including the semiconductor device of claim 1.

34. An electronic system, comprising:

a processor; an input/output device;

a bus; and a memory including the semiconductor device of claim 1.

* * * * *